United States Patent
Greatorex et al.

(10) Patent No.: US 6,856,162 B1
(45) Date of Patent: Feb. 15, 2005

(54) AC/DC MONITOR SYSTEM

(75) Inventors: James Martin Greatorex, Watsonville, CA (US); Jeffrey Miles Greatorex, Aromas, CA (US)

(73) Assignee: Vena Engineering Corp, Watsonville, CA (US)

( * ) Notice: Subject to any disclaimer, the term of this patent is extended or adjusted under 35 U.S.C. 154(b) by 0 days.

(21) Appl. No.: 10/777,459

(22) Filed: Feb. 12, 2004

(51) Int. Cl.[7] .............................................. G01R 31/34
(52) U.S. Cl. ........................ 324/772; 324/426; 320/132
(58) Field of Search ................................ 324/772, 162, 324/158.1, 426, 433, 427; 320/104, 105; 340/539.14, 539.25

(56) References Cited

U.S. PATENT DOCUMENTS

| | | | |
|---|---|---|---|
| 5,363,039 A | * 11/1994 | Kumar et al. | 324/158.1 |
| 5,656,919 A | 8/1997 | Proctor et al. | |
| 5,895,440 A | 4/1999 | Proctor et al. | |
| 6,573,745 B2 | * 6/2003 | Raftari et al. | 324/772 |

* cited by examiner

Primary Examiner—David Zarneke
Assistant Examiner—Jimmy Nguyen
(74) Attorney, Agent, or Firm—Patrick T. King

(57) ABSTRACT

A combined AC/DC monitoring system simultaneously monitors an AC power supply and a DC power supply in a mobile unit. The monitoring system is electrically isolated from an AC input source through an AC isolation transformer. A microcontroller digitally provides various computed variables from various digitized input signals. The monitoring system simultaneously displays a plurality of the computed variables while the system monitors for various user-selected high/low conditions of the computed variables. The system monitors AC power surges and can alternately displays a high voltage level for a predetermined time and a low voltage level for a predetermined time. An algorithm determines whether the AC voltage is a true sine wave or otherwise. The system monitors DC current on the high side, or positive terminal, of a battery. User selectable DC shunts are provided to measure a range of DC currents.

30 Claims, 10 Drawing Sheets

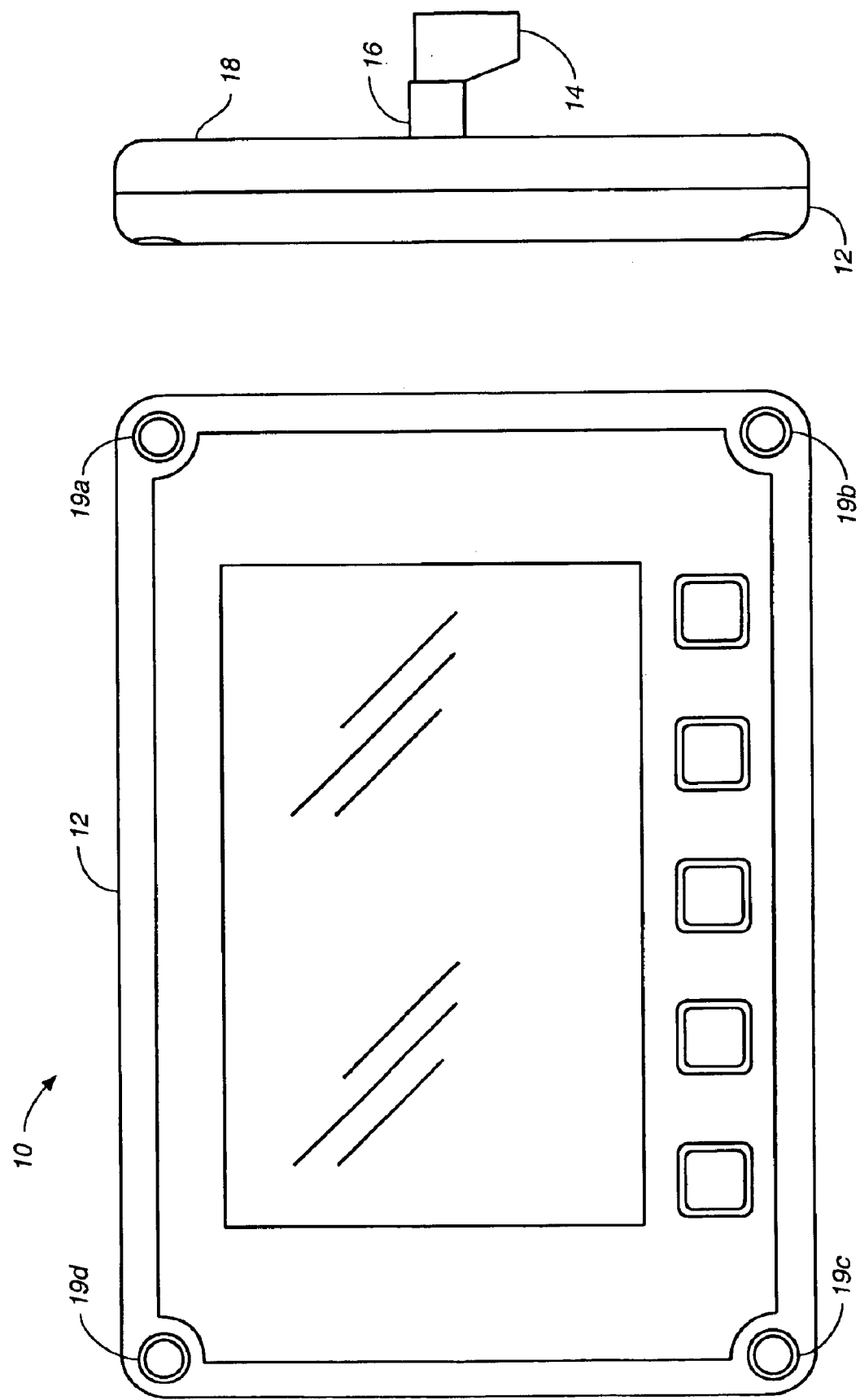

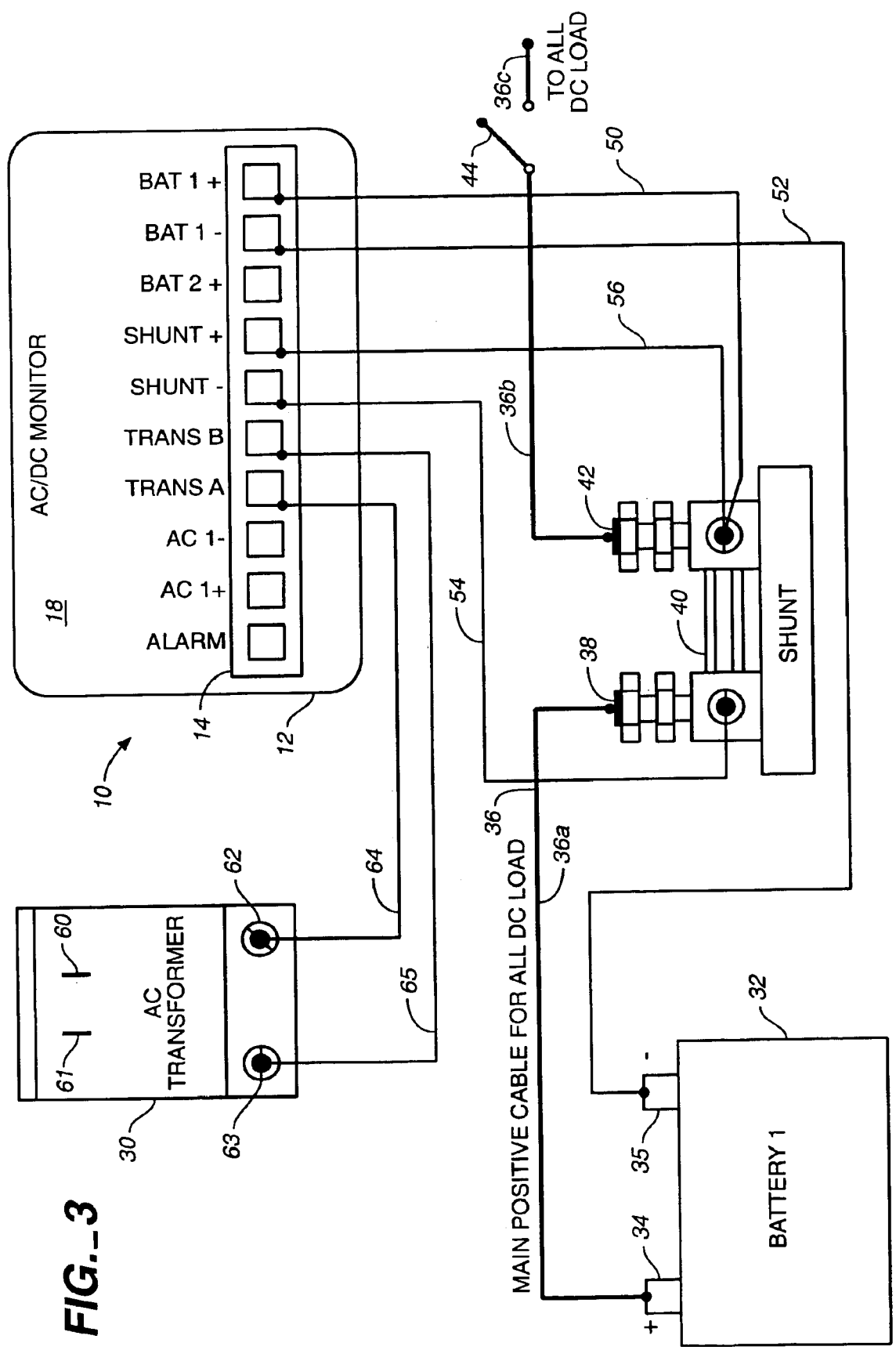
FIG._3

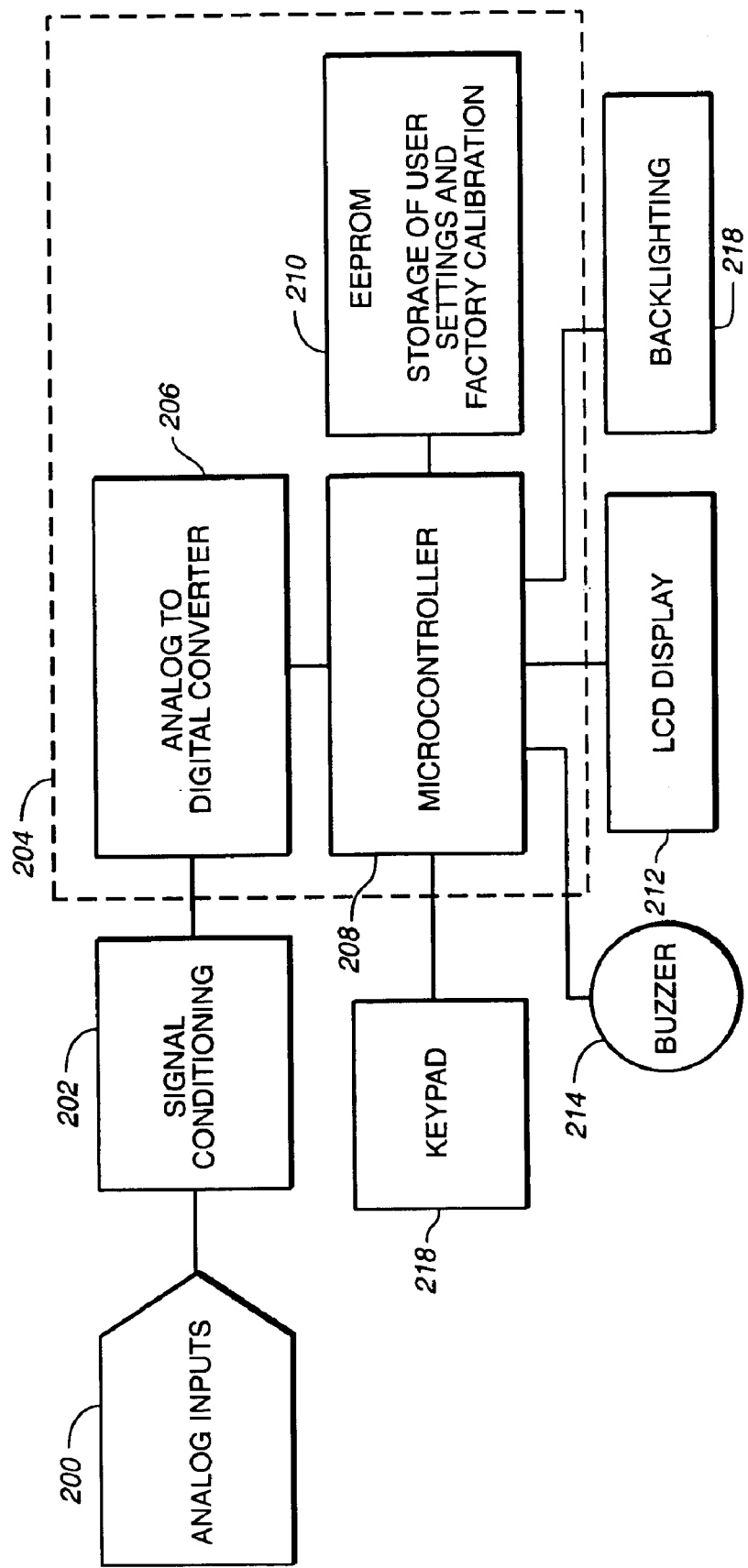
FIG._4

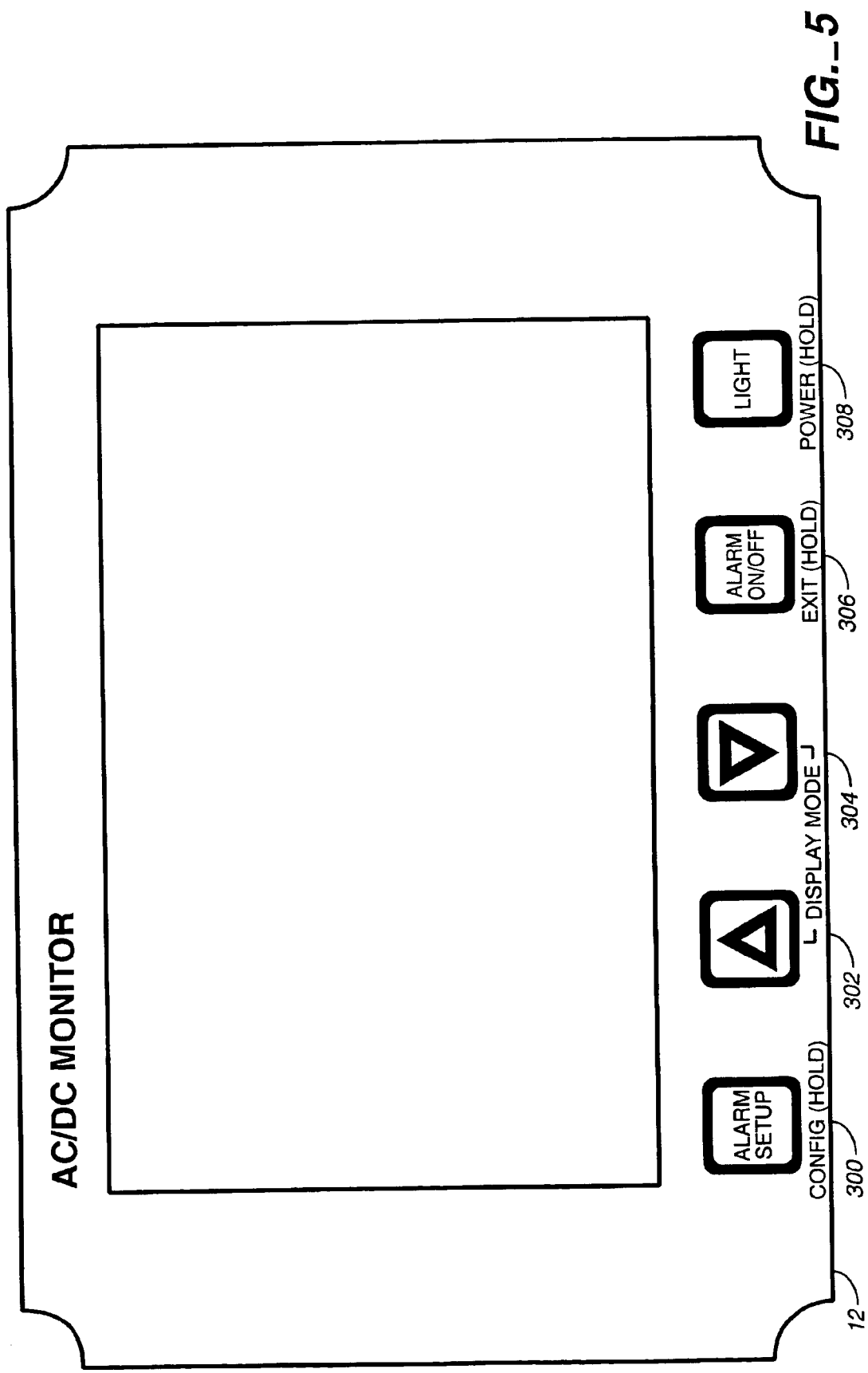
FIG._5

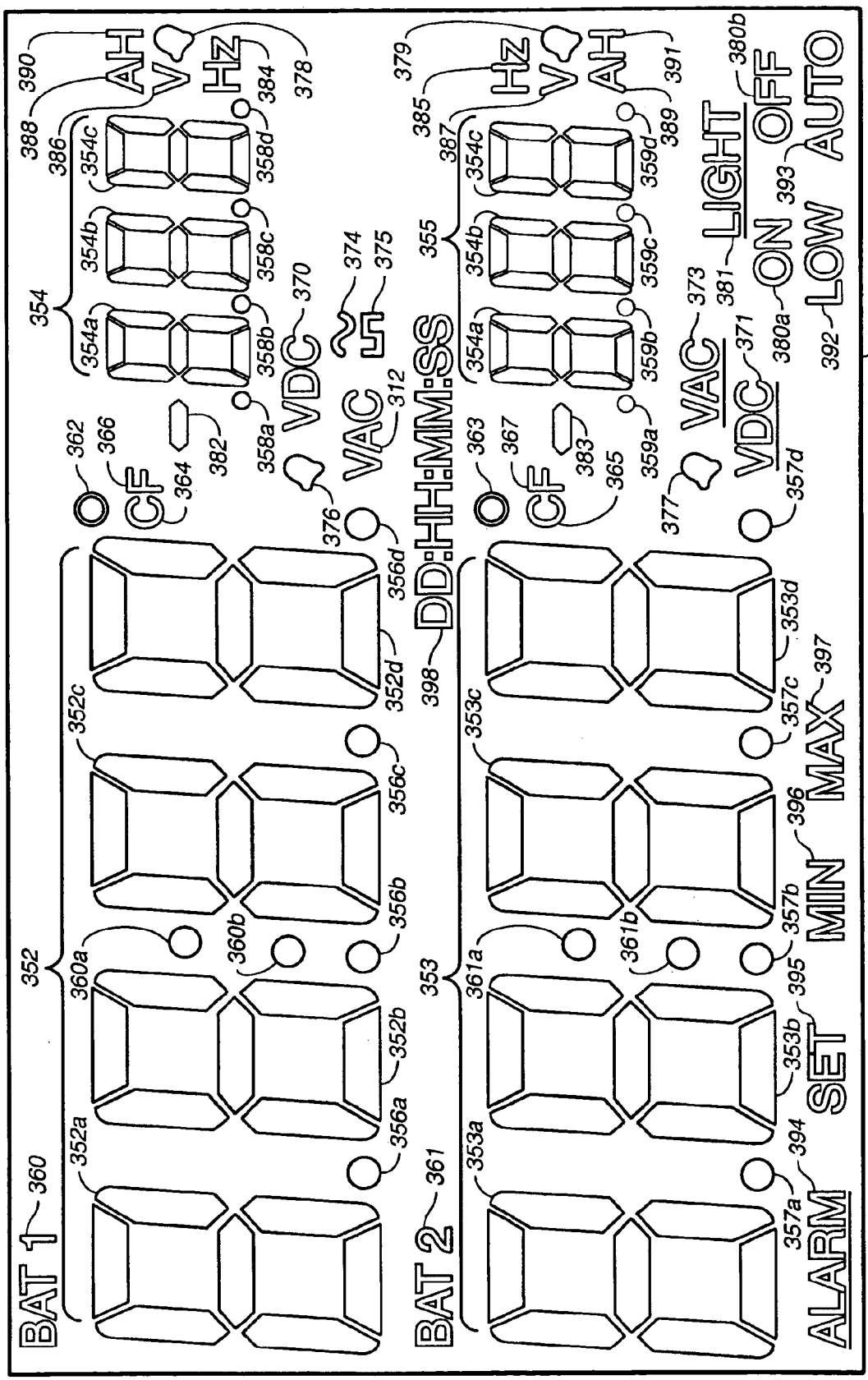
FIG._6

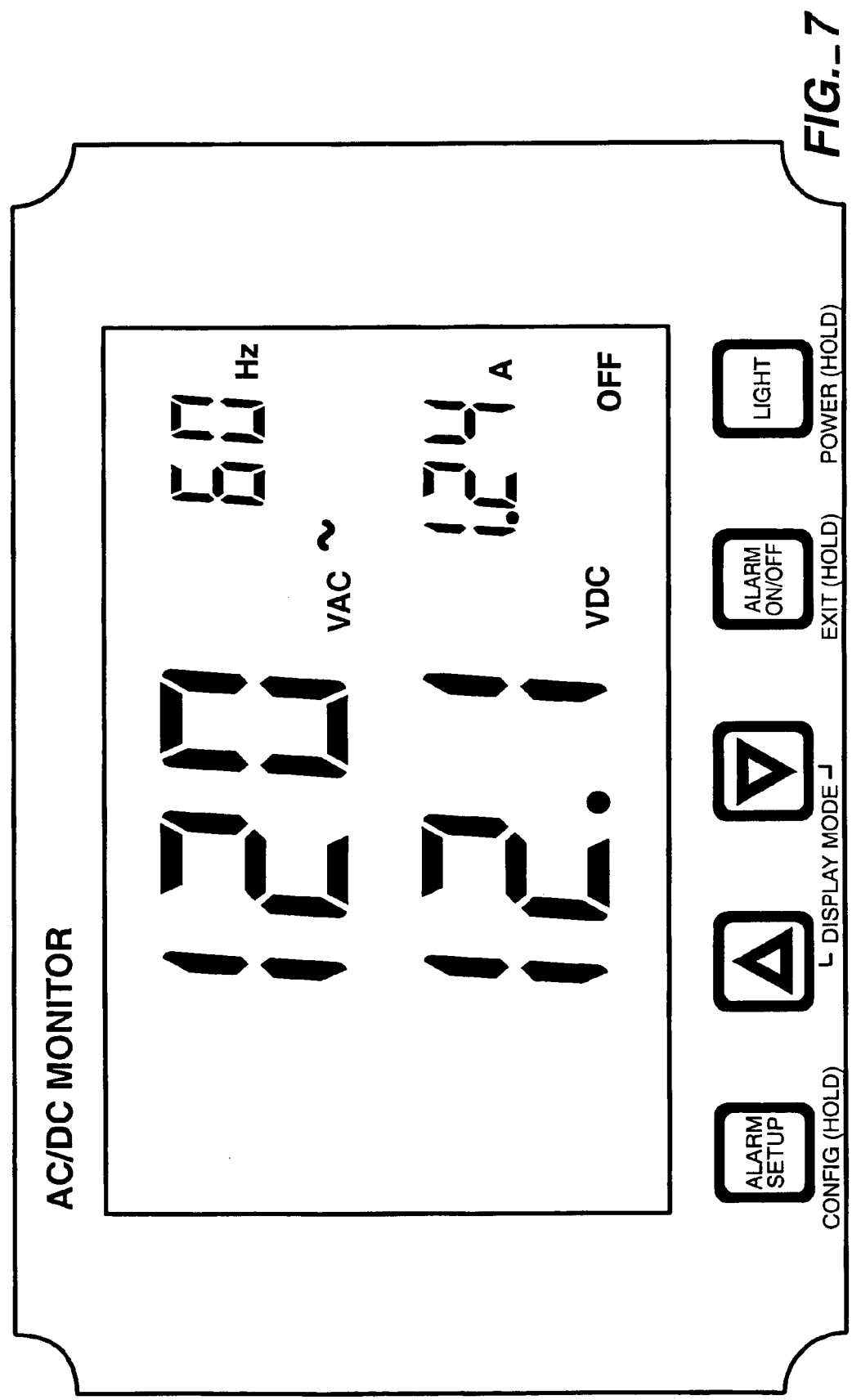
FIG._7

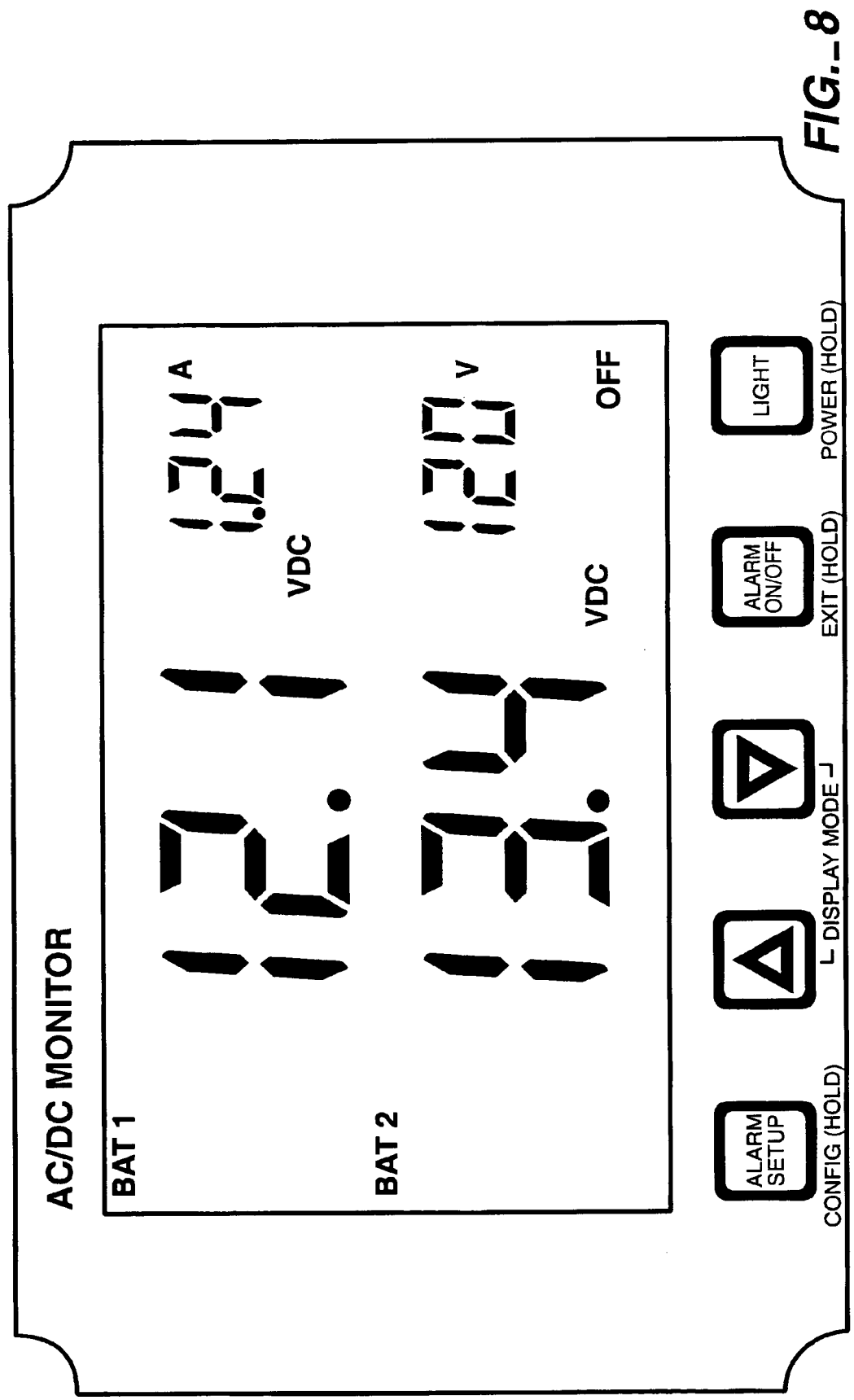
FIG._8

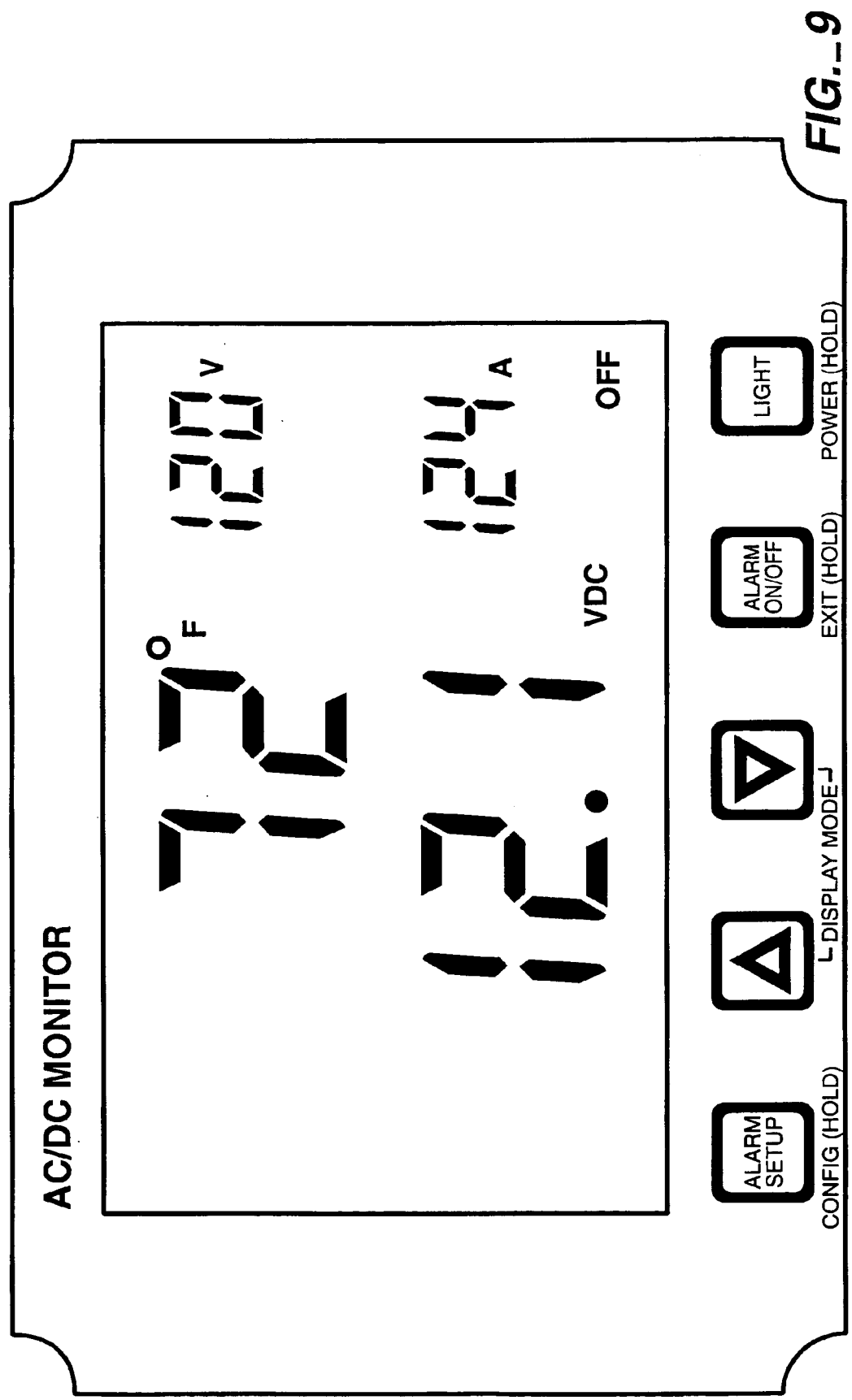
FIG._9

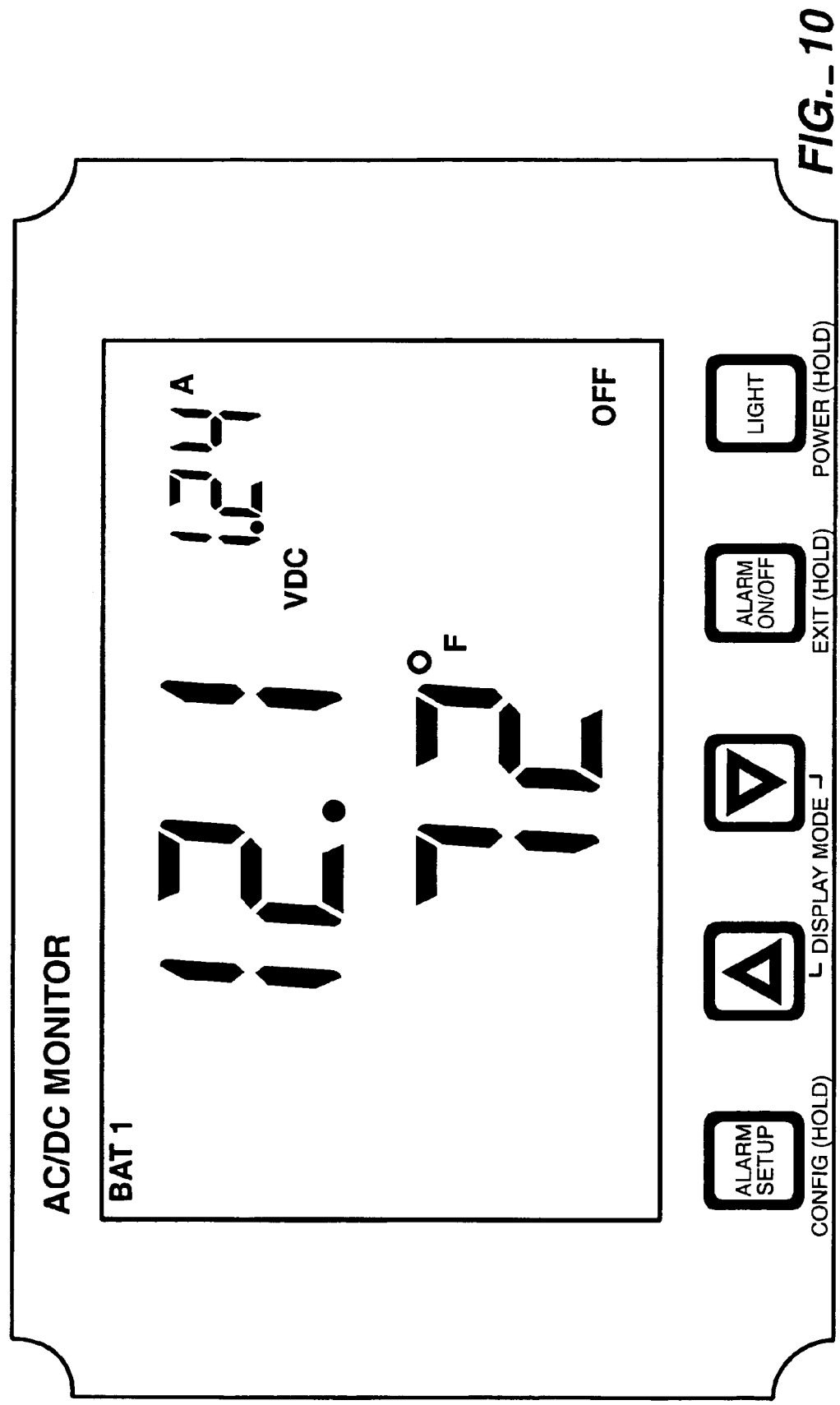
FIG._10

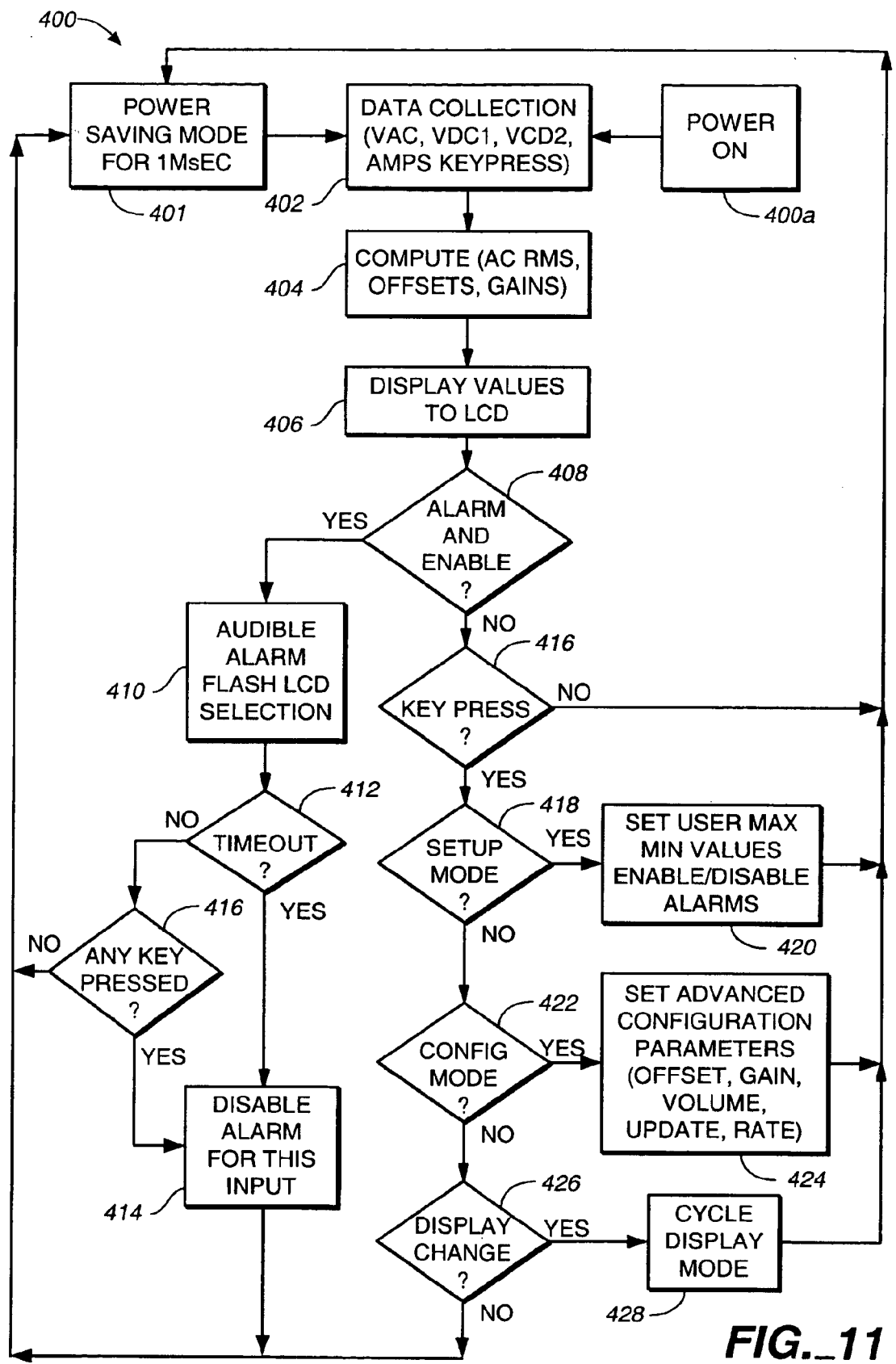
*FIG._11*

AC/DC MONITOR SYSTEM

BACKGROUND OF THE INVENTION

1. Field of the Invention

This invention relates to systems for monitoring AC and DC power supplies and, in particular to a combined AC/DC monitoring system for simultaneously monitoring an alternating current (AC) power supply and a direct current (DC) power supply in a mobile unit.

2. Prior Art

Previously, AC and DC voltages and/or currents in a mobile unit such as, for example, a recreational vehicle or a boat, were monitored with techniques that use a single multi-meter or a discrete stationary equivalent with one readout. These techniques can provide measurement and readout of only one item at a time and cannot simultaneously measure and display several measured or computed variables at a single time. Using such measurement techniques with 120 AC volts in a mobile environment can raise serious safety concerns.

Consequently, a need exists for a safe, efficient, user-friendly combined AC/DC monitoring system that allows a user to simultaneously and selectably monitor an alternating current (AC) power supply and a direct current (DC) power supply in a mobile unit, such as, for example, a recreational vehicle or a marine vessel.

SUMMARY OF THE INVENTION

It is therefore an object of the invention to provide a safe, efficient, user-friendly combined AC/DC monitoring system that allows a user to simultaneously and selectably monitor an alternating current (AC) power supply and a direct current (DC) power supply in a mobile unit. Some of the items that are monitored include an AC voltage, an AC current, an AC r.m.s. voltage, an AC frequency, a DC current, a DC voltage, DC ampere hours, and temperature.

In accordance with this and other objects of the invention, a combined AC/DC monitoring system is provided for simultaneously monitoring an AC power supply and a DC power supply in a mobile unit. The system includes a transformer for electrically isolating the AC power supply from the combined AC/DC monitoring system and for providing an isolated, AC voltage signal to the combined AC/DC monitoring system. AC voltage monitor input terminals are connected to the isolated AC signal for monitoring the isolated AC voltage signal. DC voltage monitor input terminals are connected to the DC power supply for monitoring a DC voltage for the DC power supply. A DC shunt has a first terminal that is connected to a positive, non-grounded terminal of the DC power supply. A first DC current monitor input terminal and a second DC current monitor input terminal are respectively connected to the first and to a second terminals of the DC shunt for measuring DC current from the DC power supply.

The system further includes an analog-to-digital converter ADC system having respective input terminals connected to the AC voltage monitor input terminals, the DC voltage monitor input terminals, and the DC current monitor input terminals. The ADC provides respective digital output signals indicative of instantaneous sampled values of the isolated AC signal, the DC voltage, and the DC current. the system also includes a microcontroller having input terminals for receiving respective digital output signals of the ADC. The microcontroller digitally computes various respective computed variables from the respective digital output signals received from the ADC. The invention also includes a visual display system that receives signals representative of the computed variables from the microcontroller and that simultaneously visually displays a plurality of pre-selected ones of the respective computed variables.

An alarm system is selectively activated when a pre-selected computed variable is in a respective alarm condition that is outside a predetermined limit. The microcontroller provides user menus that displayed on the visual display system. The microcontroller has keypress terminals for receiving respective user control signals from user-operated switches that are operated by a user in conjunction with the user menus to control operation of the microcontroller, the visual display system, and the alarm system.

The transformer for electrically isolating the AC power supply from the combined AC/DC monitoring system provides a lower-voltage isolated AC voltage signal to the monitoring system where the lower-voltage isolated AC voltage signal is conformable to a safety code.

The computed variables include an AC RMS voltage, AC current, AC frequency. A computed variable is provided that is indicative of an AC voltage being either a true sine wave or a modified sine wave. The microcontroller is provided with an algorithm that computes a standard deviation of a computed variable for the isolated AC signal to determine whether the isolated AC voltage is a sine wave signal or a modified sine wave signal.

The computed variables include a DC voltage, a DC current, DC ampere hours computed over a pre-selected time period. The DC power supply includes a battery. The DC power supply also includes two batteries. The DC shunt is user selectable to provide a plurality of ampere/millivolt ratings.

The visual display system includes a display screen that in one embodiment of the invention is a LCD display that is driven by the microcontroller.

The alarm system includes an audible alarm and an alarm control signal for operation of an external alarm system. An audible alarm is activated when a respective alarm condition exceeds a predetermined time period. The alarm system is not activated when a preselected computed variables is within a predetermined threshold values.

Rapidly changing computed variables are monitored for a high value and a low value that are captured to provide a local maximum and a local minimum value of the computed variable. The high value of the computed variable and the low value of the computed variable are alternately displayed for predetermined time periods on the visual display system when the difference between the high and low values exceeds a predetermined percentage.

The microcontroller provides offset signals and gain constants for various one of the respective computed variables.

The microcontroller provides a digital output signal indicative of temperature for display by the visual display system.

The mobile unit is a recreational vehicle.

The microcontroller, the display system, and the user-operated switches are packaged in a panel-mounted module.

In one embodiment of the invention, a combined AC/DC monitoring system for a recreational vehicle simultaneously monitors an AC power supply and a DC power supply and displays pre-selected computed variables. This embodiment includes a step-down isolation transformer for electrically isolating the AC power supply from the monitoring system and for providing an isolated, stepped-down AC voltage signal to the monitoring system. AC voltage monitor input terminals are connected to the isolated AC signal for monitoring the isolated AC voltage signal. DC voltage monitor input terminals are connected to the DC power supply for monitoring a DC voltage for the DC power supply. A DC shunt has a first terminal connected to a positive, non-grounded, terminal of the DC power supply. The first and a second DC current monitor input terminals are respectively connected to the terminals of the DC shunt for measuring current from the DC power supply. An analog-to-digital converter ADC system has respective input terminals connected to the AC voltage monitor input terminals, the DC voltage monitor input terminals, and the DC current monitor input terminals. The ADC provides respective digital output signals indicative of instantaneous values of the isolated AC signal, the DC voltage, and the DC current.

In this embodiment, a microcontroller in provided that has input terminals for receiving respective digital output signals of the ADC. This microcontroller digitally computes various respective computed variables from respective digital output signals received from the ADC. A visual display screen receives signals representative of the computed variables from the microcontroller and simultaneously visually displays pre-selected ones of the respective computed variables. An audible alarm is selectively activated when a pre-selected computed variable is in a respective alarm condition that is outside a predetermined limit. The microcontroller includes keypress terminals, or switches, for receiving from user-operated switches respective user control signals for operation of the microcontroller. The microcontroller provides user menus displayed on the display screen to control operation of the microcontroller, the visual display screen, and the audible alarm.

For this embodiment the computed variables are selected from a group comprising: an AC voltage, an AC current, an AC r.m.s. voltage, an AC frequency, a DC current, a DC voltage, DC ampere hours, and temperature.

A method is provided according to the present invention for simultaneously monitoring an AC power supply and a DC power supply for a mobile unit with a combined AC/DC monitoring system. The method includes the steps of: electrically isolating the AC power supply with a transformer and providing an isolated AC voltage signal to the combined AC/DC monitoring system; coupling the isolated AC signal to AC voltage monitor input terminals for monitoring the isolated AC voltage signal coupling the DC power supply to DC voltage monitor input terminals for monitoring a DC voltage for the DC power supply. For measurement of DC current from the DC power supply, the method includes connecting a first terminal of a DC shunt to a positive, non-grounded, terminal of the DC power supply, connecting the first terminal of the DC shunt to a first DC-current monitor input terminal; and connecting a second terminal of the DC shunt to a second DC-current monitor input terminal.

The method also includes coupling the AC voltage monitor input terminals, the DC voltage monitor input terminals, and the DC current monitor input terminals to input terminals of an analog-to-digital converter ADC system, and the ADC providing respective digital output signals indicative of instantaneous sampled values of the isolated AC signal, the DC voltage, and the DC current. The method further provides for receiving respective digital output signals of the ADC at input terminals of a microcontroller and said microcontroller digitally computing various respective computed variables from respective digital output signals received from the ADC.

A visual display system is provided for receiving signals representative of the computed variables from the microcontroller and simultaneously visually displaying a plurality of pre-selected ones of the respective computed variables.

An alarm system is provided for being selectively activating when a pre-selected computed variable is in a respective alarm condition that is outside a predetermined limit.

The microcontroller provides user menus that are displayed on the visual display system and the microcontroller receives at keypress terminals respective user control signals from user-operated switches that are operated by a user in conjunction with the user menus in order to control operation of the microcontroller, the visual display system, and the alarm system.

The method further includes the steps of: disabling the alarm function by operating any user-operated switch if a computed value does not exceed a predetermined value, checking for a key press. If a key is pressed and if the system is in a setup mode, the method further includes setting user max/min values and enable/disable alarm. If a key is pressed and if the system is in a configuration mode, the method further includes setting advanced configuration parameters. If a key is pressed and if the system is in a display change mode, the method includes changing the display.

In summary, the present invention provides an AC/DC monitoring system that is completely electrically isolated from an AC input source through an AC isolation transformer. Some of the features of the invention are as follows: One embodiment of the invention simultaneously displays four power variables at the same time while the system monitors for high/low conditions. The invention provides alarms for a high value of a variable and for a low values of a variable side along with a length of time for an alarm condition to be held in abeyance. Below 70 VAC, for example, no alarm sounds. The invention monitors AC power surges and can alternately display a high voltage level for a predetermined time and a low voltage level for a predetermined time. The AC/DC monitoring system according to the invention has a unique algorithm that determines whether the AC voltage is a sine wave or a "square" wave. The AC/DC monitoring system also has a unique algorithm that determines min/max levels. The AC/DC monitoring system monitors DC current on the high side, that is, positive terminal, of a battery. User selectable shunt options with different ampere/millivolt ratings are provided to provide the ability to use a 50 amp shunt to a 1000 amp shunt.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a front view of a combined AC/DC monitoring system module that has user-operated push switches and a display screen.

FIG. 2 is a side view of a combined AC/DC monitoring system module

FIG. 3 is an illustrative view of a combined AC/DC monitoring system connected for simultaneously monitoring a battery and an AC power source.

FIG. 4 is a block diagram of various functional blocks for a combined AC/DC monitoring system module.

FIG. 5 is a front view of a combined AC/DC monitoring system module showing various user-operated push switches.

FIG. 6 is a view of a layout for the various accessible display segments and indicator features of a LCD display screen.

FIG. 7 is a front view of a combined AC/DC monitoring system module that has user-operated push switches and a display screen displaying four computed variables for VAC, HZ, BAT1VDC, and DC AMPS.

FIG. 8 is a front view of the combined AC/DC monitoring system module displaying four computed variables for BAT1VDC, DC AMPS, BAT2 VDC, and VAC.

FIG. 9 is a front view of the combined AC/DC monitoring system module displaying four computed variables for VAC, HZ, BAT1VDC, and DC AMPS.

FIG. 10 is a front view of the combined AC/DC monitoring system displaying four computed variables for BAT1VDC, and temperature.

FIG. 11 is a simplified flow diagram for various steps for an AC/DC monitoring system.

DETAILED DESCRIPTION OF THE PREFERRED EMBODIMENT

Reference is now made in detail to preferred embodiments of the invention, examples of which are illustrated in the accompanying drawings. While the invention is described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIGS. 1 and 2 illustrate a combined AC/DC monitoring system 10, the components of which are packaged in a panel-mounted module 12. An external connector 14 provides electrical connections through various terminals that mate with corresponding terminals of a connector 16 that is located on a flat backside 18 of the panel-mounted module 12. The module 12 has a thin, low-profile and is designed to have its backside mounted with screws extending through mounting holes, typically shown as 19a–d, to a wall panel. Such a wall panel would have a cutout provided therein for clearance of the connectors 14, 16 and external wires extending from the connector 14. The external wires are provided, for example, with a multi-conductor telephone cable that is routed behind the wall panel.

FIG. 3 illustrates the combined AC/DC monitoring system 10 monitoring an external AC line voltage that is provided with a step-own, AC isolation transformer module 30. The module 30 is configured, for example, as a wall-mounted unit. The combined AC/DC monitoring system 10 also monitors voltage on a BAT1 primary battery 32 that has a positive terminal 34 and a negative (or ground) terminal 35.

The positive terminal 34 of the primary battery 32 is connected to one portion 36a of a primary positive battery cable 36 that is used to supply all usual DC loads in a recreational or marine vehicle, except, for example, for an engine starter load. The main positive battery cable 36 is connected in series to a positive terminal 38 of a DC shunt 40 to provide so-called high-side current monitoring. The DC shunt 40 is a precision resistor that is calibrated to provide for measurement of DC current to the DC loads. The DC shunt 40 is user selectable to provide a plurality of ampere/millivolt ratings, as specified by a user. A negative terminal 42 of the DC shunt 40 is connected in series through another portion 36b of the main positive battery cable 36 to one terminal of a DC load cutoff switch 44. Another terminal of the DC load cutoff switch is connected through another portion 36c of the main positive battery cable 36 to the DC loads.

The connector 14 has a number of pins to which are connected wires for various input signals that are monitored by the combined AC/DC monitoring system.

For measurement of the DC voltage of the BAT1 primary battery 32, the connector 14 provides a BAT1+ terminal and a BAT1− terminal. The BAT1+ terminal of the connector 14 is connected through a signal line 50 to the terminal 42 of the DC shunt 40. A BAT1− terminal of the connector 14 is connected through a signal line 52 to the negative terminal 35 of the BAT1 primary battery 32. The BAT1+ terminal and the BAT1− terminal are used for measurement of the DC terminal voltage of the BAT1 primary battery 32. Note that the primary battery 32 is used to power the combined AC/DC monitoring system 10.

For measurement of the DC voltage of an optional secondary battery, the connector 14 provides a BAT2+ terminal for connection to a positive terminal of the secondary battery. The secondary battery shares the same negative BAT1− ground terminal with the primary battery 32.

For measurement of the DC current of the BAT1 battery 32, the connector 14 provides a SHUNT+ terminal and a SHUNT− terminal. The SHUNT+ terminal of the connector 14 is connected through a signal line 54 to the positive terminal 38 of the DC shunt 40. The SHUNT− terminal of the connector 14 is connected through a signal line 54 to the negative terminal 42 of the DC shunt 40. These terminals are used for measuring the DC current from the BAT1 battery that runs through the main positive battery cable 36.

The DC shunt 40 is connected to the high-side, or positive terminal of the battery 32. In many applications, a DC shunt is connected in series with the low-side, or ground, connections of a battery. The low-side, or ground, connections of the battery are often used in common for both DC loads that use moderate currents and for high-current loads, such as a starter motor that momentarily draws a great deal of current. Measurement of current on the high-side has several advantages over a more conventional low-side measurement. One advantage is that the DC shunt can be placed close to a breaker panel. Smaller shunt amp ratings can be used if the starter current load is not going through the DC shunt. This allows a DC shunt with a smaller current rating to be used which provides greater sensitivity in terms of millivolts-per-amp, for example, that allows an accuracy, for example, of 0.01 amps rather than 0.1 amps.

The AC/DC monitoring system provides for user selectable shunt options, where the shunts have different user-selectable ampere/millivolt ratings. This provides the ability to use a shunt ranging from 50 amps to 1000 amps.

For measurement of the AC voltage on an external AC line through the AC isolation transformer module 30, the connector 14 provides transformer terminals TRANS A terminal and TRANS B. When configured as a wall-mounted unit, the AC isolation transformer module 30 has two connection blades 60, 62 that connect to corresponding sockets in a wall-mounted AC receptacle. The transformer 30 has two low-voltage output terminals 62, 63 that provide an isolated, stepped-down representation of an external AC line voltage. The isolation transformer 30 electrically isolates the AC power supply from the combined AC/DC monitoring system and provides a low-voltage isolated AC voltage signal to the monitoring system such that the combined AC/DC monitoring system 10 is conformable to, for example, a UL safety code that requires low operating voltages. The TRANS A terminal is connected through a line 64 to the low-voltage output terminal 62. The TRANS B terminal is connected through a line 65 to the low-voltage output terminal 63.

For measurement of a external AC current, the connector 14 provides AC current terminals ACI+ and ACI–. The ACI+terminal is connected to one terminal of an AC current transformer; and the ACI– terminal is connected to another terminal of the AC current transformer. A current transformer is provided, for example, as a winding around a toroidal core that has an AC conductor passing through it.

An ALARM terminal of the connector 14 provides an alarm control signal for operation of an external alarm system. When activated, the ALARM terminal provides, for example, a connection to ground that activates an external alarm device or a disconnect device for either the AC/DC monitoring system or an external DEVICE. The ALARM terminal is activated, for example, when an audible alarm is activated.

FIG. 4 illustrates various functional blocks for a combined AC/DC monitoring system module 12 of FIG. 2. Analog inputs represented by the block 200 are described in connection with the various signals provided to the terminals of the connector 14 of FIG. 1. The DC voltage provided by the BAT1 primary battery is delivered to the BAT1+ and BAT1– terminals of connector 14. The DC voltage provided by an optional BAT2 second battery is delivered to the BAT2+ and BAT1– terminals of connector 14. A voltage representing DC current of the BAT1 battery is delivered to the SHUNT+ and SHUNT– terminals of connector 14. Note that the monitoring system can be used to monitor a single battery that is in series with another battery or to monitor a series string of two or more batteries. The isolated, low-voltage AC signal provided by the AC isolation transformer module 30 is delivered to the TRANS A and TRANS B terminals of the connector 14. A voltage representative of an external AC current is delivered to the ACI+ and ACI– terminals of connector 14.

The analog input signals are then passed through appropriate signal conditioning circuits 202 to a single-package 100-pin microcontroller system 204, such as provided by the Texas Instruments Company as a MSP430 ultralow-power, mixed signal microcontroller that computes various computed variables from the various input signals. The signal conditioning circuits 202 include conventional voltage divider circuits and conventional circuits for interfacing the external voltages and currents to the low-voltage input terminals of the MSP430 microcontroller. The MSP430 microcontroller system includes a number of built-in modules and features, including an on-chip temperature measurement circuit and an analog-to-digital converter ADC module 206 with sample-and-hold capability and with an internal reference. For measurement of DC current, Texas Instruments Company provides a INA170 high-side, bi-directional current shunt monitor circuit. The MSP430 microcontroller includes a microcontroller unit 208 with a RAM. The MSP430 microcontroller includes an EEPROM Flash memory unit 210 that is used for storage of user settings and for factory calibration. The MSP430 microcontroller includes a liquid crystal display LCD driver for a liquid crystal display 212. The microcontroller includes a driver for an audible buzzer 214. A backlighting circuit 214 is provided for the LCD display. User inputs to the microcontroller system 204 are provided with a keypad unit 218 that includes several user-operated push switches.

FIG. 5 is a front view of a combined AC/DC monitoring system module 12. A central area of the module 12 is the LCD display of FIG. 4 that is shown blank. The lower front surface of the module 12 includes five user-operated push switches. The push switches include a ALARM/SETUP switch 300, an UP switch 302, a DOWN switch 304, an ALARM/ON/OFF switch 306, and a LIGHT switch 308. The five user-operated push switches are used to enter and to operate the combined AC/DC monitoring system 10 in three different modes of operation: a DISPLAY mode, a SETUP mode, land a configuration CONFIG mode.

The combined AC/DC monitoring system 10 is designed to be used in a number of mobile applications including, but not limited to, recreational vehicles, such as motor homes, travel trailers, and fifth-wheel trailers; boats and various marine applications; solar arrays; alternative energy systems; backup AC generators with starting batteries; backup AC systems: and uninterruptible power supplies.

For a typical application such as a recreational vehicle application, typical specifications for a combined AC/DC monitoring system 10 include: a DC VOLTAGE range of 4 to 40 volts; a DC current range of 0 to 200 Amps, depending on the millivolts per Amp rating of the DC SHUNT; a DC voltage resolution of 0.1 volts; a DC current resolution of 0.05 Amps; an AC voltage range for true RMS volts of 50 VAC to 130 VAC; an AC frequency range of 40 to 80 HZ; and an AC current range of 0 to 30 A with a current transformer.

Use of the Alarm/Setup Switch

When the AC/DC monitoring system 10 is in the DISPLAY mode, the ALARM/SETUP switch 300 is pressed once to enter the SETUP mode. In the SETUP mode, the alarms for all of the input signals and their computed variables can be either enabled or disabled.

When the AC/DC monitoring system 10 is in the DISPLAY mode, the ALARM/SETUP switch 300 is held for 2 seconds to have the AC/DC monitoring system enter the CONFIG mode.

When the AC/DC monitoring system 10 is in the SETUP mode, each press of the ALARM/SETUP switch 300 will cycle through all of the MIN and MAX settings for the alarms. When the AC/DC monitoring system 10 is in the SETUP mode, the ALARM/SETUP switch 300 is held for 2 seconds to remove the AC/DC monitoring system 10 from the SETUP mode and return the AC/DC monitoring system 10 to the DISPLAY mode.

When the AC/DC monitoring system 10 is in the CONFIG mode, each press of the ALARM/SETUP switch 300 will step through the configuration parameters. SEE APPENDIX FOR CONFIGURATION PARAMETERS. When the AC/DC monitoring system 10 is in the CONFIG mode, the ALARM/SETUP switch 300 is held for 2 seconds to exit the CONFIG mode and return the AC/DC monitoring system 10 to the DISPLAY mode.

Use of the up Switch and the Down Switch

When the AC/DC monitoring system 10 is in the DISPLAY mode, each press of the UP switch 302 or DOWN switch 304 will step through 4 default display options.

When the AC/DC monitoring system 10 is in the SETUP mode, each press of the UP switch 302 or the DOWN switch 304 will increment a currently selected MIN or MAX alarm value. When the AC/DC monitoring system 10 is in the SETUP mode and when the UP switch 302 or the DOWN switch 304 are held for 2 seconds, currently selected alarm values will quickly increment or decrement.

When the AC/DC monitoring system 10 is in the CONFIG mode, each press of the UP switch 302 or the DOWN switch 304 will increment or decrement a currently selected configuration parameter value.

When the AC/DC monitoring system 10 is in the CONFIG mode and when the UP switch 302 or the DOWN switch 304 are held for 2 seconds, currently selected configuration parameter values will quickly increment or decrement.

Use of the Alarm/On/Off Switch

When the AC/DC monitoring system 10 is in the DISPLAY mode, pressing the ALARM/ON/OFF switch 306 will either disable or enable all alarms.

When the AC/DC monitoring system 10 is in the SETUP mode, pressing the ALARM/ON/OFF switch 306 will enable or disable the currently selected alarm value. A bell icon and the word ON will be display when the alarm is enabled. When the AC/DC monitoring system 10 is in the SETUP mode and when the ALARM/ON/OFF switch 306 is held for 2 seconds, the AC/DC monitoring system 10 will exit the SETUP mode and return to the DISPLAY mode.

When the AC/DC monitoring system 10 is in the CONFIG mode and when the ALARM/ON/OFF switch 306 is held for 2 seconds, the AC/DC monitoring system 10 will exit the CONFIG mode and return to the DISPLAY mode.

Use of the Light Switch

When the AC/DC monitoring system 10 is in any mode and when the LIGHT switch 308 is pressed a first time, backlighting for the LCD display is turned on at a low level. When the LIGHT switch 308 is pressed a second time, backlighting for the LCD display is turned on at a high level. When the LIGHT switch 308 is pressed a third time, backlighting for the LCD display is turned off. Pressing the LIGHT switch 308 for 2 seconds turns power off to the AC/DC monitoring system 10.

FIG. 6 illustrates display segments and various indicator features provided on a LCD display screen 350. Numeric values of certain computed variables are displayed in two respective groups 352, 353 of four larger 7-segment numeric character displays 352a, 352b, 352c, 352d and 353a, 353b, 353c, 353d. Numeric values of computed variables are displayed in two respective groups 354, 355 of three smaller 7-segment numeric character displays 354a, 354b, 3542c and 355a, 355b, 355c.

For the two groups 352, 353 of larger 7-segment numeric character displays, respective decimal point display characters 356a, 356b, 356c, 356d; and 357a, 1357b, 357c, 357d; are provided.

For the two groups 354, 355 of smaller 7-segment numeric character displays, respective decimal point display characters 358a, 358b, 358c, 358d; and 359a, 359b, 359c, 359d; are provided.

For the two groups 352, 353 of larger 7-segment numeric character displays, respective colons 360a, 360b and 361a, 361b are shown between respective characters 352b, 352c and 353b, 353c.

A BAT1 character label 360 is provided for the primary battery 32 of FIG. 1. A BAT2 character label 361 is provided for a secondary battery. Temperature display characters are provided with degree symbols 362, 363, centigrade symbols "C" 364, 365 and the Fahrenheit symbol 366, 367.

For the two groups 352, 353 of larger 7-segment numeric character displays, respective DC voltage indicators VDC 370, 371; AC voltage indicators 372, 373. For Ac signals a true sine wave indicator 374 and a modified sine wave indicator 375 are provided.

For the two groups 352, 353 of larger 7-segment numeric character displays and for the two groups 354, 355 of smaller 7-segment numeric character displays, bell-shaped alarm icons 376, 377, 378, 379 are provided. An ON label 380a and OFF label 380b on the lower right-hand side of the screen 350 below a LIGHT label 381 are activated when an alarm is respectively enabled or disabled.

The group 354, 355 of smaller 7-segment numeric character displays has several display characters, including: respective minus sign characters 382, 383; respective hertz HZ characters 384, 385, respective voltage V indicators 386, 387; respective ampere A (current) indicators 388, 389; and hour H indicators 390,391 indicators.

The lower right-hand corner of the screen 350 are provided with a LOW label 392 and an AUTO label 393. The OFF label 381 is activated when the alarms are not activated.

The lower left-hand side of the screen 350 has an ALARM label 394, a SET label 395, a MIN label 396, and a MAX label 397. A days, hours, minutes, seconds DD:HH:MM:SS label 398 is provided offset from the center of the LCD display screen 350.

Turning All Alarms On/Off

When in the DISPLAY mode, all alarms can be turned on or off by pressing the ALARM ON/OFF switch 306. The OFF label 381 is displayed when all of the alarms are turned off. The ON label 380 is activated when all alarms are turned on. These conditions do not affect individual alarm enables, only the global alarm enable. Note that if an alarm is activated with an audible alarm, touching any switch will stop sounding of the audible alarm.

Backlighting

Backlighting for the display screen 350 is activated by pressing the LIGHT switch 308. Backlighting has a low level and a high level. A first press of the LIGHT switch 308 turns backlighting on low. A second press of the LIGHT switch 308 turns the backlighting on high. A third press of the LIGHT switch 308 turns backlighting off. A default setting turns the backlighting off after 10 minutes.

Enabling and Setting Alarms

Alarm settings are modified in the SETUP mode, which is entered by pressing the ALARM/SETUP switch 300 once. In this mode, only one value at a time is displayed with corresponding units. Either the MIN label 396 or the MAX label is activated for each input. Pressing the ALARM/SETUP switch 300 toggles through all inputs. The ALARM/ON/OFF switch 306 enables a currently selected alarm. When an alarm is enabled, a corresponding alarm icon 376, 377, 378, 379 is displayed along with the ON label 380.

After the alarm thresholds have been set, the ALARM/ON/OFF switch 306 is pressed and held for 2 seconds to save the alarm threshold values and to return to the DISPLAY mode. FOR a MAX alarm condition, an actual measured value must be above a threshold value for 10 seconds before an alarm is activated.

An example of setting an alarm for a low voltage for BAT1 is as follows: IN the DISPLAY mode, the ALARM/SETUP switch is pressed once. The ALARM/SETUP switch is pressed repeatedly until the BAT1 label 360 and the MIN label 396 are visibly displayed. The UP switch 302 or the DOWN switch 304 are pressed until, for example the number 11.0 is displayed on the group 352 of larger 7-segment numeric character displays 352a, 352b, 352c, 352d. The ALARM/ON/OFF switch is pressed to enable the alarm. The ALRM/ON/OFF switch 306 is pressed and held for 2 seconds to save the alarm setting and to exit the SETUP mode and return to the DISPLAY mode. Note that at any time that an audible alarm is activated, pressing any switch will turn off audible sounding of the alarm. The measurement will still be displayed and flashing even if the audible alarm is disabled. After the audible alarm is disabled, all switches resume their normal functions.

FIGS. 6, 7, 8, 9 illustrate screen presentations of various computed variable provided by the microcontroller.

FIG. 6 shows the combined AC/DC monitoring system module 12 in a DEFAULT DISPLAY MODE 1 that displays four computed variables for VAC, HZ, BAT1VDC, and DC AMPS.

FIG. 7 shows the combined AC/DC monitoring system module 12 in a DEFAULT DISPLAY MODE 2 that displays four computed variables for BAT1VDC, DC AMPS, BAT2 VDC, and VAC.

FIG. 8 is a front view of the combined AC/DC monitoring system module 12 that displays four computed variables for VAC, HZ, BAT1VDC, and DC AMPS.

FIG. 9 is a front view of the combined AC/DC monitoring system module 12 that is shown in a DEFAULT DISPLAY MODE 2 that displays four computed variables for BAT1, VDC, DC AMPS, and temperature.

FIG. 10 illustrates a flow diagram 400 showing a process for operation of an AC/DC monitoring system 10 of FIG. 1. A power on block 400a starts operation of the system. When the process is returned back to the beginning of the process from a number of points within the process, all return paths pass through a power-saving mode block 401, that provides for shutdown of the system for a predetermined time period, such as, for example, 1 millisecond. This period operation saves power.

Data collection is illustrated with a block 402 for collection of AC voltage and currents from an AC source such as a power line or a generator and DC voltage and current from one or more batteries. Data collection also includes user-entered commands provided by user keypresses of the 5 user-operated push switches on the front surface of the module 12. These user-operated push switches include the ALARM/SETUP switch 300, the UP switch 302, the DOWN switch 304, the ALARM/ON/OFF switch 306, and the LIGHT switch 308. that are used to enter and to operate the combined AC/DC monitoring system 10 in three different modes of operation: the DISPLAY mode, the SETUP mode, and the configuration CONFIG mode. The collection step includes signal conditioning and analog-to-digital conversion in an ADC.

In block 404 the microcontroller system 204 receives respective digital output signals of the ADC and digitally computes various respective computed variables from the respective digital output signals received from the ADC. The computed AC variables include: AC RMS voltage; AC current, AC frequency; determination of a true sine AC sine wave or a modified sine wave. Computed DC variables include DC voltage, DC current, and DC ampere-hours. The microcontroller provides offset signals for various one of the respective computed variables. The microcontroller also provides gain constants for various ones of the computed variables.

Block 406 indicates that the microcontroller provides display signals to a LCD for displaying various pre-selected ones of the computed variables.

An alarm decision block 408 determines whether an alarm condition has been met. If so, a block 410 sets an audible alarm and flashes an LCD display for a variable in an alarm state. A decision block 412 determines whether the alarm condition has timed out. If the alarm condition has timed out, a Block 414 disables the audible alarm for the variable in the alarm state. After disabling the audible alarm, the process returns to data collection in block 402. If the alarm condition has not yet timed out, the decision block 416 determines if any user switch has been pressed to disable the audible alarm. If no user switch has been depressed, the process returns back to block 402. If a user switch has been depressed, the process continues to block 414 to disable the audible alarm.

If the alarm decision block 408 determines that an alarm condition has not been met, the process continues to a decision block 416 that determines whether a switch has been pressed during the last pass of the process through the data collection functions of block 402. If no user switch was pressed, the process returns to data collection in block 402.

If a user switch has been pressed, the process continues to a SETUP mode decision block 418 that determines if the SETUP mode has been selected by a user and, if so, proceeds to a block 420. The block 420 provides for a user to set min/max values of a computed variable and provides for enable/disable of various alarms before the process returns to data collection in block 402.

If no SETUP mode has been selected, the process continues to a CONFIG mode decision block 422 that determines if the CONFIG mode has been selected by a user, and, if so, proceeds to a block 424. The block 424 provides for a user setting advanced configuration parameters, such as offset, gain, alarm volume, and update rates.

If no CONFIG mode has been selected, the process continues to a display change decision block 426 that determines if the display is to be changed. If so, the process continues to a block 428 that provides for cycling the display mode. If the display is not to be changed, the process returns to data collection in block 402.

One of the computations performed by the microcontroller 208 provides a computed variable that is indicative of an AC voltage being either a true sine wave or a modified sine wave. The AC/DC monitoring system operates from an internally regulated 3.3 volt supply system. An incoming isolated AC voltage taken from the AC isolation transformer module 30 is further stepped down with a resistive divider. The incoming AC signal is then offset to one-half of the reference voltage of 2.5 volts to prevent clipping. That signal is then sampled at 4 times the frequency (240 Hz) of a standard AC system (50–60 Hz). A first calculation looks for minimum values and the maximum values that are used to determine the midpoint of the signal since errors in resistor values and reference voltages may cause the signal to be offset at 1.22 volts rather than 1.25 volts. Once the midpoint is determined, the midpoint voltage is subtracted from all incoming signals. The absolute value is then taken of each sample. The standard deviation is then taken of the absolute value signals. Signals that are "square" in nature will have a very small variation in values, where signals that are sine waves will have larger values of standard deviation.

When input signals are changing rapidly, the LCD displays become difficult to read because the values displayed are rapidly changing. When a signal is changing rapidly, the monitoring system 10 is switched to a mode of operation that provides average maximum values and average minimum values of a rapidly changing input signal. In this mode of operation, the input signal is sampled and maximum values of that signal are collected and minimum values of that signal are also collected. These max and min values are then averaged to generate an average high (max) value and an average low (min) value. The LCD display is then toggled back and forth between the min and the max at a reasonable viewing interval.

The present invention finds application in various types of mobile units where a combined AC/DC monitoring system for simultaneously monitoring an AC power supply and a DC power supply is needed. Such mobile units include recreational vehicles such as motor homes of various types and various towed vehicles such as trailers of various types. Such mobile units are used in connection with mobile units for marine applications, solar arrays, and alternative energy sources used with mobile units.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A combined AC/DC monitoring system for simultaneously monitoring an AC power supply and a DC power supply in a mobile unit, comprising:

a transformer for electrically isolating the AC power supply from the combined AC/DC monitoring system and for providing an isolated, AC voltage signal to the combined AC/DC monitoring system;

AC voltage monitor input terminals connected to the isolated AC signal for monitoring the isolated AC voltage signal;

DC voltage monitor input terminals connected to the DC power supply for monitoring a DC voltage for the DC power supply;

a DC shunt, said DC shunt having a first terminal connected to a positive, non-grounded terminal of the DC power supply and said DC shunt having a second terminal;

a first DC current monitor input terminal and a second DC current monitor input terminal that are respectively connected to the first and to the second terminals of the DC shunt for measuring DC current from the DC power supply;

an analog-to-digital converter ADC system having respective input terminals connected to the AC voltage monitor input terminals, the DC voltage monitor input terminals, and the DC current monitor input terminals, wherein the ADC provides respective digital output signals indicative of instantaneous sampled values of the isolated AC signal, the DC voltage, and the DC current;

a microcontroller having input terminals for receiving respective digital output signals of the ADC, wherein said microcontroller digitally computes various respective computed variables from the respective digital output signals received from the ADC;

a visual display system that receives signals representative of the computed variables from the microcontroller and that simultaneously visually displays a plurality of pre-selected ones of the respective computed variables;

an alarm system that is selectively activated when a pre-selected computed variable is in a respective alarm condition that is outside (exceeds) a predetermined limit;

wherein the microcontroller provides user menus displayed on the visual display system and wherein the microcontroller has keypress terminals for receiving respective user control signals from user-operated switches that are operated by a user in conjunction with the user menus to control operation of the microcontroller, the visual display system, and the alarm system.

2. The combined AC/DC monitoring system of claim 1 wherein the transformer for electrically isolating the AC power supply from the combined AC/DC monitoring system provides a lower-voltage isolated AC voltage signal to the monitoring system and wherein the lower-voltage isolated AC voltage signal is conformable to a safety code.

3. The combined AC/DC monitoring system of claim 1 wherein the respective computed variables include an AC RMS voltage.

4. The combined AC/DC monitoring system of claim 1 wherein the microcontroller includes input terminals for receiving signals indicative of AC current from the AC power supply and wherein the microcontroller provides a computed variable for AC current.

5. The combined AC/DC monitoring system of claim 1 wherein the respective computed variables include an AC frequency.

6. The combined AC/DC monitoring system of claim 1 wherein the respective computed variables include a computed variable that is indicative of the AC voltage being either a true sine wave or a modified sine wave.

7. The combined AC/DC monitoring system of claim 1 wherein the microcontroller is provided with an algorithm that computes a standard deviation of a computed variable for the isolated AC signal to determine whether the isolated AC voltage is a sine wave signal or a modified sine wave signal.

8. The combined AC/DC monitoring system of claim 1 wherein the respective computed variables include a DC voltage.

9. The combined AC/DC monitoring system of claim 1 wherein the respective computed variables include a DC current.

10. The combined AC/DC monitoring system of claim 9 wherein the respective computed variable include DC ampere hours computed over a pre-selected time period.

11. The combined AC/DC monitoring system of claim 1 wherein the DC power supply includes a battery.

12. The combined AC/DC monitoring system of claim 11 wherein the DC power supply includes two batteries.

13. The combined AC/DC monitoring system of claim 1 wherein the DC shunt is user selectable to provide a plurality of ampere/millivolt ratings.

14. The combined AC/DC monitoring system of claim 1 wherein the visual display system includes a display screen.

15. The combined AC/DC monitoring system of claim 1 wherein the visual display system that simultaneously visually displays a plurality of pre-selected ones of the respective computed variables includes a LCD display that is driven by the microcontroller.

16. The combined AC/DC monitoring system of claim 1 wherein the alarm system includes an audible alarm.

17. The combined AC/DC monitoring system of claim 1 wherein the alarm system provides an alarm control signal for operation of an external alarm system.

18. The combined AC/DC monitoring system of claim 1 wherein the respective audible alarms are activated when a respective alarm condition exceeds a predetermined time period.

19. The combined AC/DC monitoring system of claim 11 wherein the alarm system is not activated when a preselected computed variables is below a predetermined threshold values.

20. The combined AC/DC monitoring system of claim 1 wherein the respective computed variables include, for monitoring rapidly changing respective computed variables, a high value of a respective computed variable and a low value of the respective computed variable.

21. The combined AC/DC monitoring system of claim 20 wherein the microcontroller is provided with an algorithm that determines that the respective computed variable is rapidly changing over a predetermined period of time and that and that captures a local maximum and a local minimum value of the respective computed variable.

22. The combined AC/DC monitoring system of claim 20, for monitoring voltage surges, wherein the high value of the computed variable and the low value of the computed variable are alternately displayed for predetermined time periods on the visual display system when the difference between the high and low values exceeds a predetermined percentage.

23. The combined AC/DC monitoring system of claim 1 wherein the microcontroller provides offset signals for various one of the respective computed variables.

24. The combined AC/DC monitoring system of claim 1 wherein the microcontroller provides gain constants for various ones of the computed variables.

25. The combined AC/DC monitoring system of claim 1 wherein the microcontroller provides a digital output signal indicative of temperature for display by the visual display system.

26. The combined AC/DC monitoring system of claim 11 wherein the mobile unit is a recreational vehicle.

27. The combined AC/DC monitoring system of claim 1 wherein the microcontroller, the display system, and the user-operated switches are packaged in a panel-mounted module.

28. A combined AC/DC monitoring system for a recreational vehicle that simultaneously monitors an AC power supply and a DC power supply and that display pre-selected computed variables, comprising:

a step-down isolation transformer for electrically isolating the AC power supply from the monitoring system and for providing an isolated, stepped-down AC voltage signal to the monitoring system;

AC voltage monitor input terminals connected to the isolated AC signal for monitoring the isolated AC voltage signal;

DC voltage monitor input terminals connected to the DC power supply for monitoring a DC voltage for the DC power supply;

a DC shunt, said DC shunt having a first terminal connected to a positive; non-grounded, terminal of the DC power supply and said DC shunt having a second terminal;

first and second DC current monitor input terminals respectively connected to the first and to the second terminals of the DC shunt for measuring current from the DC power supply;

an analog-to-digital converter ADC system having respective input terminals connected to the AC voltage monitor input terminals, the DC voltage monitor input terminals, and the DC current monitor input terminals, wherein the ADC provides respective digital output signals indicative of instantaneous values of the isolated AC signal, the DC voltage, and the DC current;

a microcontroller having input terminals for receiving respective digital output signals of the ADC, said microcontroller digitally computing various respective computed variables from the respective digital output signals received from the ADC;

a visual display screen that receives signals representative of the computed variables from the microcontroller and that simultaneously visually displays pre-selected ones of the respective computed variables;

an audible alarm that is selectively activated when a pre-selected computed variable is in a respective alarm condition that is outside a predetermined limit;

wherein the microcontroller includes keypress terminals for receiving from user-operated switches respective user control signals for operation of the microcontroller;

wherein the microcontroller provides user menus that are displayed on the display screen and wherein the microcontroller has keypress terminals for receiving respective user control signals from user-operated switches that are operated by a user in conjunction with the user menus to control operation of the microcontroller, the visual display screen, and the audible alarm; and wherein the computed variables are selected from a group comprising: an AC voltage, an AC current, an AC r.m.s. voltage, an AC frequency, a DC current, a DC voltage, DC ampere hours, and temperature.

29. A method of simultaneously monitoring an AC power supply and a DC power supply for a mobile unit with a combined AC/DC monitoring system, comprising the steps of:

electrically isolating the AC power supply with a transformer and providing an isolated AC voltage signal to the combined AC/DC monitoring system;

coupling the isolated AC signal to AC voltage monitor input terminals for monitoring the isolated AC voltage signal;

coupling the DC power supply to DC voltage monitor input terminals for monitoring a DC voltage for the DC power supply;

for measurement of DC current from the DC power supply, connecting a first terminal of a DC shunt to a positive, non-grounded terminal of the DC power supply, connecting the first terminal of the DC shunt to a first DC-current monitor input terminal; and connecting a second terminal of the DC shunt to a second DC-current monitor input terminal;

coupling the AC voltage monitor input terminals, the DC voltage monitor input terminals, and the DC current monitor input terminals to input terminals of an analog-to-digital converter ADC system, and the ADC providing respective digital output signals indicative of instantaneous sampled values of the isolated AC signal, the DC voltage, and the DC current;

receiving respective digital output signals of the ADC at input terminals of a microcontroller and said microcontroller digitally computing various respective computed variables from respective digital output signals received from the ADC;

a visual display system receiving signals representative of the computed variables from the microcontroller and simultaneously visually displaying a plurality of pre-selected ones of the respective computed variables;

selectively activating an alarm system when a pre-selected computed variable is in a respective alarm condition that is outside a predetermined limit;

the microcontroller providing user menus that are displayed on the visual display system;

the microcontroller receiving at keypress terminals respective user control signals from user-operated switches that are operated by a user in conjunction with the user menus to control operation of the microcontroller, the visual display system, and the alarm system.

30. The method of claim 29 including the steps of:

disabling the alarm function by operating any user-operated switch;

if a computed value does not exceed a predetermined value, checking for a key press;

if a key is pressed and if the system is in a setup mode, setting user max/min values and enable/disable alarm;

if a key is pressed and if the system is in a configuration mode, setting advanced configuration parameters; and if a key is pressed and if the system is in a display change mode, changing the display.

* * * * *